United States Patent [19]
Shi et al.

[11] Patent Number: 5,998,805
[45] Date of Patent: Dec. 7, 1999

[54] ACTIVE MATRIX OED ARRAY WITH IMPROVED OED CATHODE

[75] Inventors: Song Q. Shi, Phoenix; Franky So, Tempe, both of Ariz.; Hsing-Chung Lee, Calabasas, Calif.

[73] Assignee: Motorola, Inc., Schaumburg, Ill.

[21] Appl. No.: 08/988,976

[22] Filed: Dec. 11, 1997

[51] Int. Cl.$^6$ ................................................ H01L 33/00
[52] U.S. Cl. ........................ 257/40; 257/59; 257/72; 257/88; 257/94; 257/96; 257/97; 257/103
[58] Field of Search ......................... 257/40, 103, 94, 257/96, 97, 88, 72, 59

[56] References Cited

U.S. PATENT DOCUMENTS

| | | | |
|---|---|---|---|
| 5,625,199 | 4/1997 | Baumbach et al. | 257/40 |
| 5,789,766 | 8/1998 | Huang et al. | 257/88 |
| 5,804,836 | 9/1998 | Heeger et al. | 257/40 |
| 5,889,291 | 3/1999 | Koyama et al. | 257/59 |

*Primary Examiner*—William Mintel
*Attorney, Agent, or Firm*—Eugene A. Parsons; William E. Koch

[57] ABSTRACT

An active matrix OED array with an improved device cathode includes a plurality of control transistors formed on a semiconductor substrate with insulating material positioned over the control transistors to form a planar surface. A plurality of contact pads are formed on the planar surface and electrically coupled to the control transistors. A thin (5 Å to 20 Å) electron injecting layer of either alkaline metal oxide or alkaline metal fluoride is positioned on each contact pad and organic material is deposited on the electron injecting layer so as to define an organic light emitting device on each contact pad and electrical and light conducting material is positioned over the organic material to define a second terminal for the OEDs.

24 Claims, 3 Drawing Sheets

ACTIVE MATRIX OED ARRAY WITH IMPROVED OED CATHODE

FIELD OF THE INVENTION

The present invention pertains to active matrices of organic light emitting devices and more specifically to active matrices of organic light emitting devices with improved cathodes.

BACKGROUND OF THE INVENTION

Displays utilizing two dimensional arrays, or matrices, of pixels each containing one or more light emitting devices are very popular in the electronic field and especially in portable electronic and communication devices, because large amounts of data and pictures can be transmitted very rapidly and to virtually any location.

Light emitting diode (LED) arrays are becoming more popular as an image source in both direct view and virtual image displays. One reason for this is the fact that LEDs are capable of generating relatively high amounts of light (high luminance), which means that displays incorporating LED arrays can be used in a greater variety of ambient conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices.

Also, organic light emitting diodes or organic electroluminescent devices (OLED or OED, hereinafter OED) and arrays thereof are emerging as a potentially viable design choice for use in small products, especially small portable electronic devices, such as pagers, cellular and portable telephones, two-way radios, data banks, etc. OED arrays are capable of generating sufficient light for use in displays under a variety of ambient light conditions (from little or no ambient light to bright ambient light). Further, OEDs can be fabricated relatively cheaply and in a variety of sizes from very small (less than a tenth millimeter in diameter) to relatively large (greater than an inch) so that OED arrays can be fabricated in a variety of sizes. Also, OEDs have the added advantage that their emissive operation provides a very wide viewing angle.

One problem complicating the fabrication of OED arrays is the fact that the various layers of each OED must be deposited on a planar surface, thus, complicating the integration of an active network into the array. If an active circuit for each pixel of the array is positioned adjacent and to one side of each pixel, for example, the fill factor (the ratio of luminescent area to non-luminescent area) for the array will be so poor it will produce unsatisfactory images.

Generally, OEDs include a first electrically conductive layer (or first contact), an electron transporting and emission layer, a hole transporting layer and a second electrically conductive layer (or second contact). Generally, the various layers must be positioned on a planar surface at least defining the extent of the OED. The light can be transmitted either way but must exit through one of the conductive layers. OEDs generally utilize a layer of low work function metal in the cathode to ensure efficient electron injecting electrodes and low operating voltages. However, the low work function metals are reactive and susceptible to oxygen and moisture, and oxidation of the metal limits the lifetime of the devices. A hermetic seal is normally required to achieve long term stability and longevity. Several types of hermetic seals are utilized, the most common of which are inorganic materials, such as metals and the like which add greatly to the size, weight, and complexity of the OEDs.

Accordingly, it would be beneficial to provide an active OED array and driving apparatus which overcomes these problems.

It is a purpose of the present invention to provide a new and improved active OED array and driving apparatus with improved electron injection which does not require hermetic sealing.

It is another purpose of the present invention to provide a new and improved active OED array and driving apparatus with higher efficiency and reliability.

It is still another purpose of the present invention to provide a new and improved active OED array and driving apparatus which is easier and less expensive to fabricate and use.

It is a further purpose of the present invention to provide a new and improved active OED array and driving apparatus in which the OED, active circuits and drivers are integrated onto a single substrate.

It is a still further purpose of the present invention to provide a new and improved active OED array and driving apparatus in which the OED, active circuits and drivers are integrated onto a single substrate and passivation is not required.

SUMMARY OF THE INVENTION

The above problems and others are at least partially solved and the above purposes and others are realized in an active matrix OED array with an improved device cathode including a plurality of control transistors formed on a semiconductor substrate with insulating material positioned over the control transistors to form a planar surface. A plurality of contact pads are formed on the planar surface and electrically coupled to the control transistors. A thin electron injecting layer of either alkaline metal oxide or alkaline metal fluoride is positioned on each contact pad and organic material is deposited on the electron injecting layer so as to define an organic light emitting device on each contact pad. Electrical and light conducting material is positioned over the organic material to define a second terminal for the OEDs.

Generally, the dielectric layer of either alkaline metal oxide or alkaline metal fluoride is thin enough to permit easy electron tunneling therethrough and in a preferred embodiment is less than 50 Å thick and generally lies in a range of 1 Å to 20 Å. Also, the electron injecting layer may include an alkaline metal oxide such as $LiO_x$, $MgO_x$, $CaO_x$, or $CsO_x$ or an alkaline metal fluoride such as LiF, $MgF_2$, or $CaF_2$.

BRIEF DESCRIPTION OF THE DRAWINGS

Referring to the drawings.

DESCRIPTION OF THE PREFERRED EMBODIMENT

Figure 1:
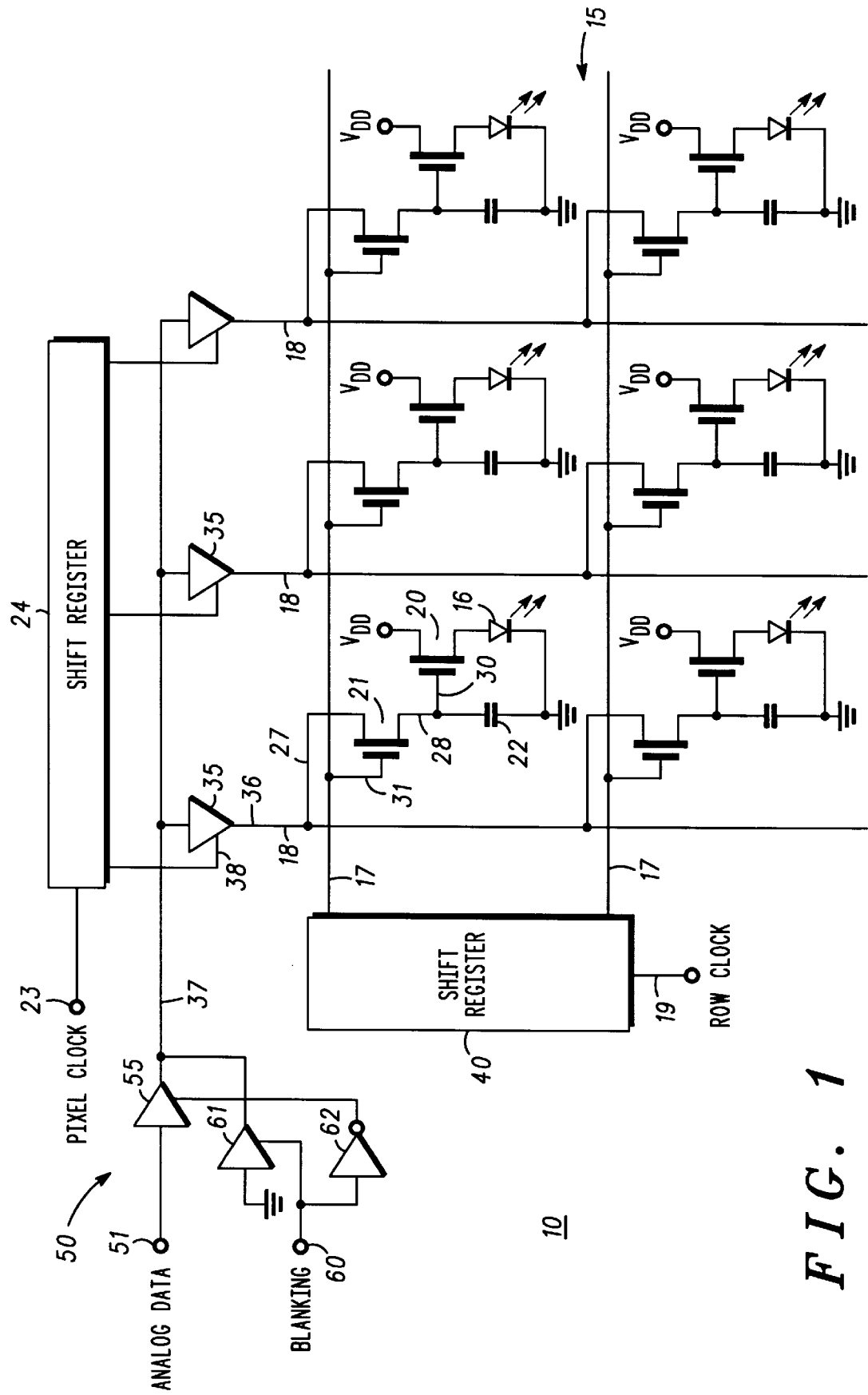
FIG. 1 is a simplified schematic diagram of an active matrix and driver circuits in accordance with the present invention.

Turning now to FIG. 1, a simplified schematic diagram is illustrated of a preferred embodiment of a driver and display assembly 10 in accordance with the present invention. Assembly 10 includes an active matrix 15 of light emitting devices 16. In this preferred embodiment, light emitting devices 16 are organic electroluminescent devices (OEDs) and will be referred to hereinafter as OEDs 16. It will be understood from this disclosure that assembly 10 is useful in conjunction with OEDs 16, but assembly 10 is also useful in conjunction with other light emitting devices, such as inorganic electroluminescent displays (ACEL).

OEDs 16 are arranged in an array, defining active matrix 15, of rows and columns, with each row including a row bus 17 and each column including a column bus 18. Each OED 16 has associated therewith an analog transistor 20 connected in series with the associated OED 16 between a source of power $V_{DD}$ and a common connection, in this example ground. A charge storage device, in this example a capacitor 22, is connected between a control electrode of each analog transistor 20 and ground. It will of course be understood that many different types of charge storage devices have been developed, (e.g. various semiconductor diodes, etc.) many of which can be utilized as the charge storage device herein. Each OED 16 further has associated therewith a switching transistor 21 having a first current carrying terminal 27 connected to a column bus 18 of active matrix 15, a second current carrying terminal 28 connected to a control terminal 30 of analog transistor 20 and a row control terminal 31 connected to a row bus 17 of active matrix 15.

In this specific embodiment, transistors 20 and 21 are thin-film transistors (TFTs) which are integrated onto the same substrate as OEDs 16. Also, for convenience, the first current carrying terminal of the TFTs is hereinafter referred to as a drain, the second current carrying terminal is referred to as a source, and the control terminal is referred to as a gate. Further, while each OED 16 and its associated transistors 20 and 21 and capacitor 22, form a pixel, or a picture element, in this example, it will be understood that a plurality of OEDs can be connected in parallel to provide brighter pixels and redundancy and/or a plurality of OEDs, each of which emits different colored light, can be connected in parallel to form a single pixel in a full color display. Matrix 15 is referred to as an "active" matrix because each OED 16 is controlled by its associated transistors 20 and 21 and capacitor 22 within the matrix.

Each column bus 18 has a column access circuit 35 connected thereto. Each column access circuit 35 includes an output 36 connected to the associated column bus 18, a signal input 37 and a control input 38. While column access circuits 35 are illustrated as a type of switchable amplifier, it will be understood from the following description that any of a variety of simple switching circuits might be utilized, including such devices as the well known transfer gates, and the like.

A row switching circuit, which in this specific example is a shift register 40 but which might include a variety of different logic circuits, is coupled to each row bus 17 of active matrix 15 for sequentially selecting and connecting each row bus 17 into an active circuit. In this simplified example, shift register 40 connects a positive pulse, generated by a row clock (indicated at 19) to each of the row buses, one row bus 17 at a time. While in this example, shift register 40 sequences through the rows, from row 1 through row n and then back to row 1 for the next sequence, it will be understood that other sequences might be developed, all of which are considered to be sequentially selected and connected.

Similarly, a column switching circuit is coupled to each control input 38 of each column access circuit 35 for sequentially connecting each of the control inputs 38 of each column access circuit 35, one control input 38 at a time, to the associated column bus 18. Again, in this specific example, the column switching circuit is a shift register 24 but a variety of different logic circuits might be utilized. In this simplified example, shift register 24 connects a positive pulse, generated by a column clock (indicated at 23) to each control input 38 of column access circuits 35, one control input 38 at a time. It should further be understood that, the timing of row clock 19 and column clock 23 are such that shift register 24 cycles through all of column access circuits 35, one column access circuit at a time, for each row bus 17 that is activated. Thus, if active matrix 15 includes, for example, 64 columns by 32 rows, each time one of the 32 rows is accessed by shift register 40 all 64 of the columns are accessed, one column at a time, by shift register 24.

An analog signal source, generally designated 50, is coupled to each signal input 37 of each column access circuits 35. While analog signal source 50 may be a variety of different sources, including a voltage source with a plurality of amplitude steps, in this specific embodiment it is a sampling circuit for converting analog data available at an input terminal 51 into digital pulses. Analog signal source 50 includes a first switching circuit 55 connected to input terminal 51 to receive the analog data directly at the signal input. An output of switching circuit 55 is connected to signal inputs 37 of column access circuits 35. A blanking signal input terminal 60 is connected to a control input of a second switching circuit 61 and to a signal input of an inverter 62. A signal input of switching circuit 61 is connected directly to ground and an output of switching circuit 61 is connected to each signal input 37 of each column access circuits 35. An output of inverter 62 is connected to a control input of switching circuit 55.

In operation, the pixel clock pulse supplied to terminal 23 causes shift register 24 to start shifting. The shifted pulses are applied to control inputs 38, which turns on access switches 35, one switch at a time. Each time a column access switch 35 is turned on a peak voltage pulse is supplied from switching circuit 55 to the source of switching TFT transistor 21. Simultaneously a row strobe signal is supplied by shift register 40 to the gate of switching TFT transistor 21, so that transistor 21 is turned ON and the peak voltage pulse is stored in capacitor 22. The stored voltage is applied to the gate terminal of analog TFT transistor 20 so as to convert the peak voltage pulse into a current proportional to the peak voltage pulse. This current flows through the associated OED 16 and generates light proportional to the current. The charge stored in capacitor 22 is applied to gate 30 of analog transistor 20, which turns on transistor 20 an amount equal to the amplitude of the charge, i.e. larger charges turn analog transistor 20 on harder and vice versa. The amount that analog transistor 20 is turned on determines the amount of current that flows through analog transistor 20 and OED 16 from source VDD to ground.

Shift register 24 then produces the next shifted pulse t control input 38 of the next column access switch 35. Because the voltage stored in capacitor 22 decays very lowly, the stored voltage maintains almost a constant brightness of generated light until the next sampling cycle (frame). In the next sampling cycle or frame, depending upon the amplitude of the peak voltage pulse, capacitor 22 will get charged (or discharged) to the amplitude of that next peak voltage pulse. Blanking input 60 is provided, in this example, to allow insertion and blanking capabilities.

Thus, analog data supplied to terminal 51 is, periodically sampled, so as to appear as a series of peak voltage pulses or bits at signal inputs 37 of column access circuits 35. Each peak voltage pulse generated by analog signal source 50 is applied through one activated column access circuit 35 to all of the gates 31 of switching transistors 21 in the column associated with the activated column access circuit 35. Also, shift register 40 is supplying a strobe or activating signal to only one row at a time so that each data pulse is supplied to gate 31 of only one addressed pixel. In the example given above, the first 64 data pulses are applied, one each, to the 64 pixels in row 1, the next 64 data pulses are applied, one each, to the 64 pixels on row 2, etc. After 32 rows have been accessed, a complete frame or image is generated.

Here it should be noted that once capacitor 22 is charged to the value of the data pulse, switching transistor 21 is turned off by the natural sequencing of shift registers 24 and 40. Thus, capacitor 22 has no discharge path and remains charged. As long as capacitor 22 remains charged, analog transistor 20 remains in the on state and current is supplied to OED 16. Therefore, OED 16 remains conducting throughout the frame, and until the next data pulse is applied to switching transistor 21. If the next data pulse has a smaller amplitude, capacitor 22 will discharge to that level and again activate analog transistor 20 for the next frame. If the next data pulse has a larger amplitude, capacitor 22 will charge to the new level and again activate analog transistor 20 for the next frame.

While the specific embodiment disclosed herein utilizes two FETs and a storage device as a switch in circuit with each OED to produce an active array, it will be understood by those skilled in the art that fewer or additional components can be incorporated within the concepts of the present invention. Also, while thin film transistors (TFTs) are incorporated as the active switch and CMOS drivers are used as row and column drivers in the preferred embodiment, it will be understood that other components and types can be substituted in accordance with the precepts of this invention.

Figure 2:
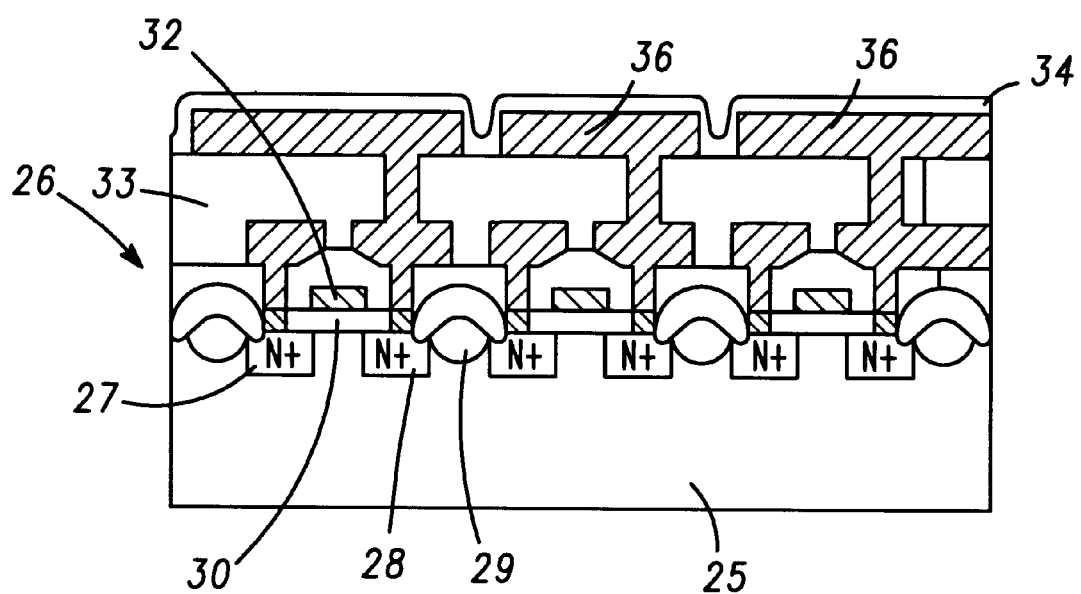
FIG. 2 is a simplified cross-sectional view of a portion of an active matrix illustrating an intermediate step in the fabrication of the active matrix.

Turning now to FIG. 2, a simplified cross-sectional view of a portion of active matrix 10 is illustrated, showing an intermediate step in the fabrication thereof. In this specific embodiment, a semiconductor substrate 25 is provided having an array area and driver areas defined thereon. In this preferred embodiment substrate 25 is formed of p-doped silicon, but may be any of the well known materials including silicon, gallium arsenide, silicon carbide, sapphire, etc. A plurality of field effect transistors (FETs, 3 of which are illustrated) are formed on substrate 25 using conventional semiconductor processing techniques, which processing techniques depend largely on the type of material used in substrate 25. It should be understood that FIG. 2 represents a portion of array 10 with the FETs being formed in the array area on semiconductor substrate 25 and in rows and columns. For convenience, a single FET 26 will be discussed.

Figure 4:
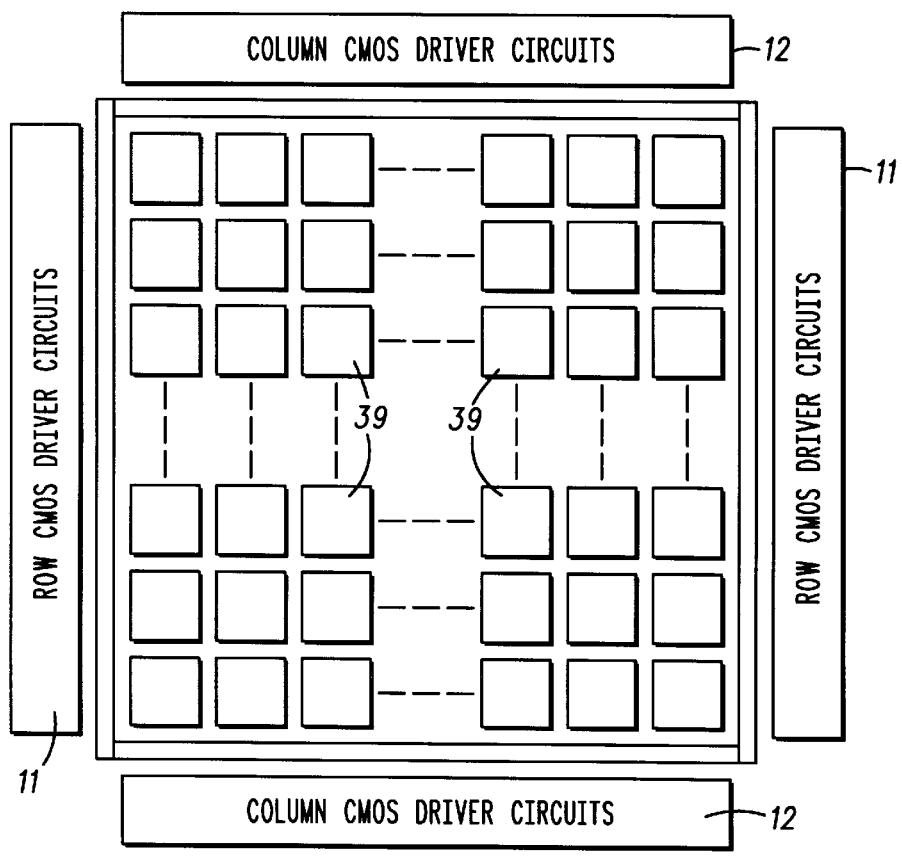
FIG. 4 is a view in top plan of the active matrix of FIG. 3 and associated driver circuits on a single substrate.

FET 26 incldes a drain terminal 27 and a source terminal 28, formed by doping areas of substrate 25 with N+ dopant in a conventional technique. A field oxide 29 surrounds FET 26 and isolates FET 26 from electrical communication with adjacent FETs. A layer of gate oxide 30 is formed on the surface of substrate 25 and openings are formed therethrough to communicate with drain terminal 27 and source terminal 28. A poly-silicon gate terminal 32 is formed on the surface of gate oxide 30 between drain terminal 27 and source terminal 28. While a MOSFET is illustrated in this preferred embodiment, it will be understood that other types of transistors or FETs can be utilized, if desired and convenient. Further, each gate terminal in each column of FETs is connected to a column bus 17, for example, gate terminal 32 extends into and out of FIG. 2 to form a column bus 17 (as shown in FIG. 1) that continues across the array area and into electrical communication with column drivers in driver areas 12 (as shown in FIG. 4).

Metal is deposited in the openings through gate oxide 30 to form ohmic contacts with drain terminal 27 and source terminal 28. A thick layer of dielectric, in this example $SiO_2$, is formed over the entire array area and openings are again formed in correspondence with the metal contacting drain terminal 27 and source terminal 28. A metallization step is then performed to provide an electrical contact for each of drain terminal 27 and source terminal 28. At this time, all of the drain contacts in each row are connected together by a row bus formed during the metallization step. At this point a complete array of field effect transistors is formed on substrate 25 with the drain terminals connected in rows and the gate terminals connected in columns. It will of course be understood that drivers are normally fabricated, using conventional semiconductor processing techniques, during the fabrication of the array of field effect transistors. Further, because of the low power consumption and simplicity of manufacture, the driver circuits normally include CMOS VLSI driver circuits.

A planarizing layer 33 of insulating material, which in this specific example includes a layer of field silicon oxide ($SiO_2$), is positioned over the array of field effect transistors in the array area so as to define a substantially planar surface. Planarizing layer 33 can be deposited by any convenient process including, for example, a CMP process. Openings are formed through planarizing layer 33 in communication with the source contact of each FET in the array. A plurality of contact pads 36 are formed on the planar surface of planarizing layer 33 in the array area in rows and columns, one to define each pixel in the array. As will be understood presently, the size and shape of each contact pad 36 determines the size and shape of the light emitting area of each pixel in the array area. Also, the openings through planarizing layer 33 are filled to electrically connect each contact pad 36 with the source of the FET beneath each contact pad 36. In this embodiment contact pads 36 and the source connections are formed by depositing a layer of aluminum and patterning the layer to define the individual pads.

With the individual contact pads 36 defined, an electron injection enhancement layer 34 including one of alkaline metal oxides or alkaline metal fluorides is positioned on each contact pad 36. Electron injection enhancement layer 34 includes either an alkaline metal oxide, such as $LiO_x$, $MgO_x$, $CaO_x$, and $CsO_x$, or an alkaline metal fluoride, such as LiF, $MgF_2$, and $CaF_2$. In the embodiment illustrated, electron injection enhancement layer 34 is deposited over the entire structure in a blanket layer and, since the alkaline metal oxide or alkaline metal fluoride is a dielectric, there is no danger of shorting adjacent contact pads 36. Because the alkaline metal oxide or alkaline metal fluoride is a dielectric, electrons injected into the OEDs from contact pads 36 tunnel through electron injection enhancement layer 34, rather than overcoming the injection barrier between contact pads 36 and the organic material of the OEDs. Thus, electron injection layer 34 should be thin enough to facilitate the tunneling action. Generally, electron injecting layer 34 is less than 50 Å thick and in a preferred embodiment has a thickness in a range of approximately 1 Å to 20 Å. By providing a thin dielectric layer for electron tunneling, rather than requiring the electron to overcome a barrier, electron injection is enhanced and the OED has improved characteristics, including a higher efficiency and a lower operating voltage. It should be pointed out that the electron injection enhancement layer 34 may not be a continuous medium, especially when the thickness is only on the order of a few angstroms.

Figure 3:
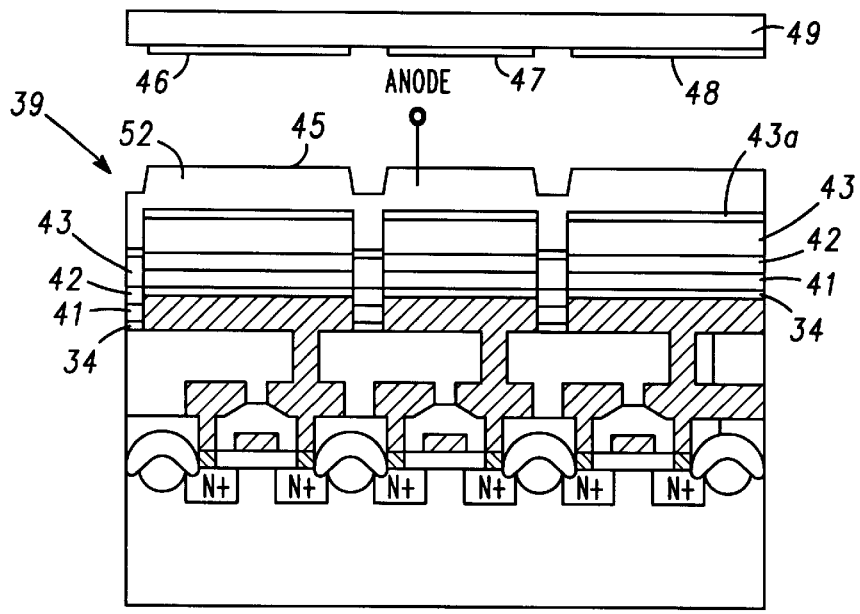
FIG. 3 is a simplified cross-sectional view, similar to FIG. 2, illustrating the complete active matrix.

Turning now to FIG. 3, plurality of layers of organic electroluminescent media are sequentially formed in overlying relationship on electron injecting layer 34 in the array area so as to define an organic light emitting device (OED) 39 on each contact pad 36 with each contact pad 36 operating as a first terminal of the overlying OED 39. In practice, the organic material is deposited in blanket films covering the entire array area, as illustrated in FIG. 3. In this specific embodiment, the organic electroluminescent medium is preferred to be capable of emitting white light upon electrical or optical stimulation. It will of course be understood that additional or fewer organic layers may be utilized, depending upon the specific type and application of the OED.

Electrical and light conducting material is positioned in overlying relationship on the surface of layer 43 in the array area to operate as a common second terminal of OEDs 39. It should be understood that, since light is emitted through the second terminal, the second terminal includes a transparent or semitransparent layer of material, such as gold, silver, palladium, ITO, $ZnO_x$, $VO_x$, or combinations thereof. In this specific example, the electrical and light conducting material includes a very thin layer 52 of gold with a thicker layer 45 of indium-tin-oxide. Layer 52 of gold is thin enough to conduct light therethrough and is included to improve the conductivity of layer 45, as well as to match the electrical characteristics of hole transporting layer 43. It should be understood that organic layers 41, 42, 43 and 43a conduct current chiefly in the vertical direction, i.e. directly between contact pad 36 and layers 52 and 45 so that the light emission area of each OED 39 is defined substantially by the underlying contact pad 36.

Turning now to FIG. 4, a view in top plan is illustrated of active matrix 10 of FIG. 3 and associated driver circuits integrated on a single substrate where 11 designates row CMOS driver circuits and 12 designates column CMOS driver circuits. Here it can be seen that each OED 39 is limited in area only by the size of the array area and the number of OEDs formed in that area. The fill factor of the array area is greatly improved because the space between adjacent pixels (OEDs 39) is only required to be large enough to prevent electrical contact between adjacent contact pads 36. Also, because of the novel construction, manufacture of active matrix structure 10 is greatly simplified. Further, because no etching and other potentially defect and/or impurity producing procedures are required, reliability of the structure is improved. Also, no reactive metals are used so that passivation or sealing of active matrix 10 or Individual OEDs 39 is simplified.

To achieve a color display, the disclosed active matrix OED array will be combined with a known color filter such as an absorption filter or field sequential color filter.

In one embodiment, (see FIG. 3) absorption color filters with red, green and blue filtering elements, 46, 47, and 48, respectively, are fabricated on a separate glass substrate 49. The fabrication method of color filters are well documented in the liquid crystal display industry. The size of each color filtering element, 46, 47, and 48 is matched to the size of each pixel or OED 39 on the active matrix array. In a color OED display, glass substrate 49 with color filter elements 46, 47, and 48 is placed on top of the active matrix OED array with the color filtering elements aligned and facing the active OED array. The glass substrate 49 with color filtering elements is sealed with the substrate with OED array by an adhesive such as epoxy (not shown). The alignment and the closeness of the two substrates will be the keys to producing an undistorted color display.

In an alternative embodiment, a field sequential color filter is placed on top of the embodied active matrix OED array to generate colors from the white light. The fabrication and use of field sequential color filter have been documented in several publications (e.g. U.S. Pat. No. 4,019,808; U.S. Pat. No. 4,635,051). The field sequential color filter is fastened to the top of the active matrix OED array by an adhesive. A color display is achieved by synchronous electronic switching of the display with the filter. The field sequential color filter also serves as the encapsulation plate for the display.

Thus, a new and improved active OED array and driving apparatus have been disclosed with a high fill factor which is easier and less expensive to fabricate and use. The new and improved active OED array and driving apparatus includes an array of OEDs, active circuits and drivers integrated onto a single substrate with no passivation required to improve reliability.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An active matrix organic light emitting device array with improved device cathode comprising:

a substrate having an array area defined thereon;

a plurality of control transistors formed on the substrate in the array area;

a planarizing layer of insulating material positioned over the plurality of control transistors in the array area and defining a substantially planar surface;

a plurality of contact pads formed on the planar surface of the planarizing layer in the array area, the plurality of contact pads being electrically coupled with the plurality of control transistors;

an electron injecting layer of one of alkaline metal oxide and alkaline metal fluoride positioned on each contact pad of the plurality of contact pads;

a plurality of layers of organic material sequentially formed in overlying relationship on each of the electron injecting layers in the array area so as to define an organic light emitting device on each contact pad with each contact pad operating as a first terminal of an overlying organic light emitting device; and electrical and light conducting material positioned in overlying relationship over the layers of organic material in the array area and defining a second terminal of each of the organic light emitting devices.

2. An active matrix organic light emitting device array as claimed in claim 1 wherein the substrate includes one of silicon, GaAs, SiC, and sapphire.

3. An active matrix organic light emitting device array as claimed in claim 1 wherein the plurality of control transistors includes MOSFETs.

4. An active matrix organic light emitting device array as claimed in claim 1 wherein the plurality of layers of organic material includes an electron transporting layer, a light emitting layer and a hole transporting layer sequentially formed in overlying relationship.

5. An active matrix organic light emitting device array as claimed in claim 1 wherein the planarizing layer of insulating material includes $SiO_2$.

6. An active matrix organic light emitting device array as claimed in claim 1 wherein the first terminal of each of the overlying organic light emitting devices is a cathode.

7. An active matrix organic light emitting device array as claimed in claim 6 wherein the second terminal includes a transparent or semitransparent layer of material selected from a group including gold, silver, palladium, ITO, $ZnO_x$, $VO_x$, and combinations thereof.

8. An active matrix organic light emitting device array as claimed in claim 1 wherein the electron injecting layer is less than 50 Å thick.

9. An active matrix organic light emitting device array as claimed in claim 1 wherein the electron injecting layer has a thickness in a range of approximately 1 Å to 20 Å.

10. An active matrix organic light emitting device array as claimed in claim 1 wherein the electron injecting layer including an alkaline metal oxide from the group $LiO_x$, $MgO_x$, $CaO_x$, and $CsO_x$.

11. An active matrix organic light emitting device array as claimed in claim 1 wherein the electron injecting layer including an alkaline metal fluoride from the group LiF, $MgF_2$, and $CaF_2$.

12. An active matrix organic light emitting device array as claimed in claim 1 wherein the electrical and light conducting material includes at least one light filter for producing a color display.

13. An active matrix organic light emitting device array with improved device cathode comprising:
   a substrate having an array area defined thereon;
   a plurality of field effect transistors, each including first and second current carrying terminals and a control terminal, formed in the array area on the substrate in rows and columns, each of the rows including a row bus coupled to the first current carrying terminal of each field effect transistor in the row, and each of the columns including a column bus coupled to the control terminal of each field effect transistor in the column;
   a planarizing layer of insulating material positioned over the plurality of field effect transistors in the array area and defining a substantially planar surface;
   a plurality of contact pads formed on the planar surface of the planarizing layer in the array area in rows and columns, one contact pad associated with each field effect transistor of the plurality of field effect transistors and coupled to the second current carrying terminal of the associated field effect transistor;
   an electron injecting layer of one of alkaline metal oxide and alkaline metal fluoride positioned on each contact pad of the plurality of contact pads;
   a plurality of layers of organic material sequentially formed in overlying relationship on the electron injecting layer in the array area so as to define an organic light emitting device on each contact pad with each contact pad operating as a first terminal of an overlying organic light emitting device; and
   electrical and light conducting material positioned in overlying relationship over the layers of organic material in the array area and operating as a common second terminal of the organic light emitting devices.

14. An active matrix organic light emitting device array as claimed in claim 13 wherein the substrate includes one of silicon, GaAs, SiC, and sapphire.

15. An active matrix organic light emitting device array as claimed in claim 13 wherein the plurality of control transistors includes MOSFETs.

16. An active matrix organic light emitting device array as claimed in claim 13 wherein the plurality of layers of organic material includes an electron transporting layer, a light emitting layer and a hole transporting layer sequentially formed in overlying relationship.

17. An active matrix organic light emitting device array as claimed in claim 13 wherein the planarizing layer of insulating material includes $SiO_2$.

18. An active matrix organic light emitting device array as claimed in claim 13 wherein the first terminal of each of the overlying organic light emitting devices is a cathode.

19. An active matrix organic light emitting device array as claimed in claim 18 wherein the second terminal includes a transparent or semitransparent layer of material selected from a group including gold, silver, palladium, ITO, $ZnO_x$, $VO_x$, and combinations thereof.

20. An active matrix organic light emitting device array as claimed in claim 13 wherein the electron injecting layer is less than 50 Å thick.

21. An active matrix organic light emitting device array as claimed in claim 13 wherein the electron injecting layer has a thickness in a range of approximately 1 Å to 20 Å.

22. An active matrix organic light emitting device array as claimed in claim 13 wherein the electron injecting layer including an alkaline metal oxide from the group $LiO_x$, $MgO_x$, $CaO_x$, and $CsO_x$.

23. An active matrix organic light emitting device array as claimed in claim 13 wherein the electron injecting layer including an alkaline metal fluoride from the group LiF, $MgF_2$, and $CaF_2$.

24. An active matrix organic light emitting device array as claimed in claim 13 wherein the electrical and light conducting material includes a light filter component for producing a color display.

* * * * *